(12) United States Patent
Ogihara et al.

(10) Patent No.: US 7,361,935 B2
(45) Date of Patent: Apr. 22, 2008

(54) SEMICONDUCTOR DEVICE, LED PRINT HEAD, THAT USES THE SEMICONDUCTOR, AND IMAGE FORMING APPARATUS THAT USES THE LED PRINT HEAD

(75) Inventors: Mitsuhiko Ogihara, Hachioji (JP); Hiroyuki Fujiwara, Hachioji (JP); Masataka Muto, Hachioji (JP); Takahito Suzuki, Hachioji (JP); Tomoki Igari, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 11/363,292

(22) Filed: Feb. 23, 2006

(65) Prior Publication Data

US 2006/0192214 A1 Aug. 31, 2006

(30) Foreign Application Priority Data

Feb. 25, 2005 (JP) ............................. 2005-050215

(51) Int. Cl.
*H01L 27/15* (2006.01)
(52) U.S. Cl. ...................................... 257/79; 257/690
(58) Field of Classification Search .................. 257/79, 257/40, 22, 13, 690; 362/84; 438/22; 399/45; 346/107

See application file for complete search history.

(56) References Cited

U.S. PATENT DOCUMENTS

| | | | | |
|---|---|---|---|---|
| 4,527,179 A | * | 7/1985 | Yamazaki | .................... 257/13 |
| 5,177,500 A | * | 1/1993 | Ng | ............................. 347/245 |
| 5,408,105 A | * | 4/1995 | Adachi et al. | ............... 257/13 |
| 6,150,668 A | * | 11/2000 | Bao et al. | ...................... 257/40 |
| 6,614,056 B1 | * | 9/2003 | Tarsa et al. | .................... 257/91 |
| 6,696,704 B1 | * | 2/2004 | Maeda et al. | ................. 257/98 |
| 7,132,691 B1 | * | 11/2006 | Tanabe et al. | ................ 257/79 |
| 2002/0076226 A1 | * | 6/2002 | Ishimizu et al. | ............. 399/45 |
| 2004/0089939 A1 | * | 5/2004 | Ogihara et al. | ............. 257/690 |

FOREIGN PATENT DOCUMENTS

| JP | 10-063807 | 3/1998 |
|---|---|---|
| JP | 2004-179641 | 6/2004 |

* cited by examiner

*Primary Examiner*—Jerome Jackson
*Assistant Examiner*—Jami M Valentine
(74) *Attorney, Agent, or Firm*—Rabin & Berdo, PC

(57) ABSTRACT

A semiconductor device includes a substrate, conductive layer, semiconductor thin films, and individual electrodes. The conductive layer is formed on the substrate and serves as a common electrode. The thin films are bonded on the conductive layer. Each of the plurality of semiconductor thin films includes at least one active region and a contact layer that is in electrical contact with the conductive layer. Each of the individual electrodes is formed on a surface of a corresponding one of the semiconductor thin films in electrical contact with the active region. The thin film may be a single thin film that includes a plurality of active regions formed therein, in which case a different common electrode may be used instead of the common electrode which is in contact with the surface and is electrically isolated from the individual electrodes.

17 Claims, 14 Drawing Sheets

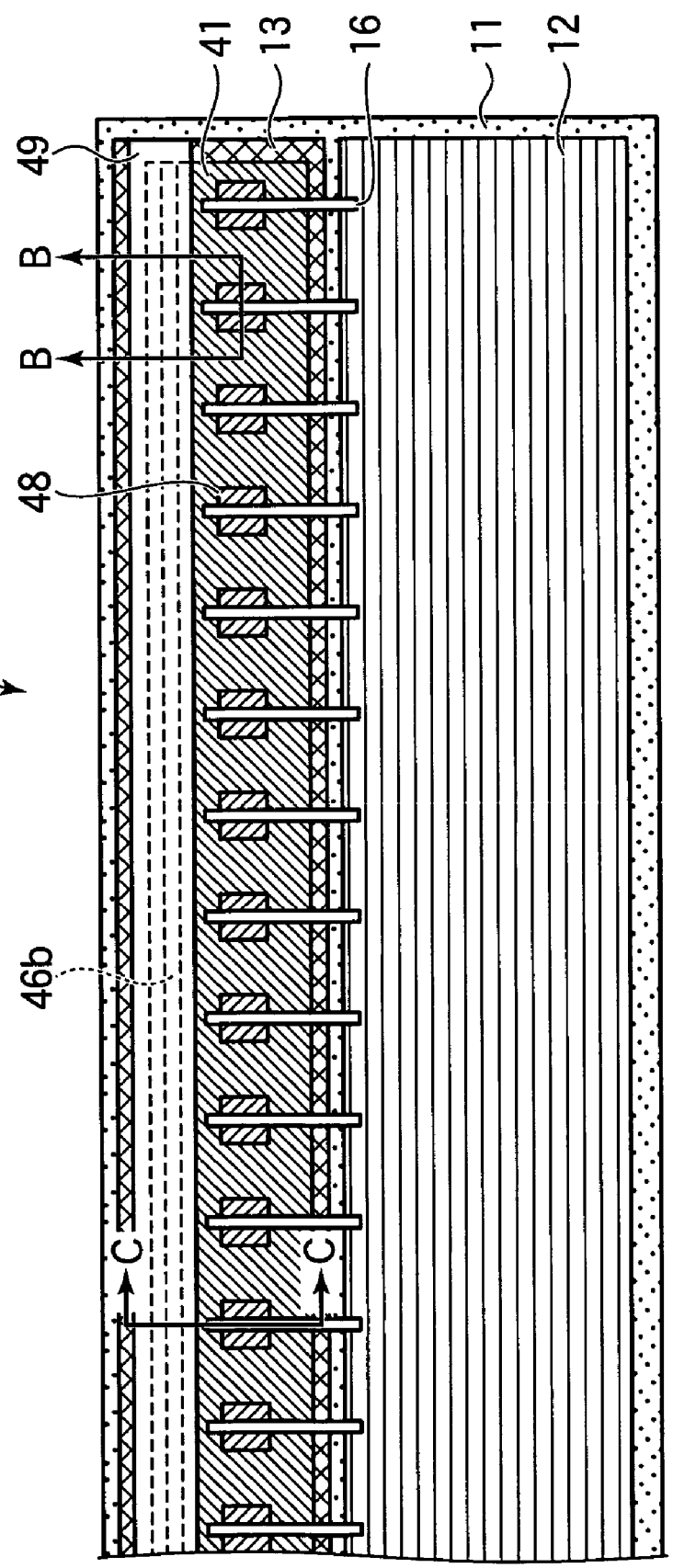

SEMICONDUCTOR DEVICE, LED PRINT HEAD, THAT USES THE SEMICONDUCTOR, AND IMAGE FORMING APPARATUS THAT USES THE LED PRINT HEAD

BACKGROUND OF THE INVENTION

1. Field of the Invention

The present invention relates to a semiconductor device such as a light emitting diode (LED) chip, an LED print head that uses the semiconductor device, and an image forming apparatus that incorporates the LED print head.

2. Description of the Related Art

FIG. 17 is a schematic perspective view illustrating a portion of a conventional LED print head 500. FIG. 18 is a top view illustrating a portion of an LED array chip 502 that can be applied to the LED print head in FIG. 17. Referring to FIG. 17, the print head 500 includes a substrate 501 on which LED array chips 502 and drive IC chips 504 are mounted. The LED array chip 502 and drive IC chip 504 are electrically connected through bonding wires 506. The LED array chip 502 includes light emitting elements 507 as shown in FIG. 18, aligned in a line. Each of the light emitting elements includes a electrode 508, which is electrically connected to an electrode pad 503.

FIG. 19 is a cross sectional view taken along a line H-H of FIG. 18. Referring to FIG. 19, a back surface electrode 510 is a common electrode. A GaAsP epi-layer 512 and a GaAs substrate 511 are common to individual light-emitting regions (Zn diffusion region 513). An interlayer dielectric film 514 is formed on the GaAsP epi-layer 512 and the individual light-emitting region 513. Current flows from the individual electrode 508 into the Zn diffusion region 513, then passing through a pn junction into the GaAsP epi-layer 512 and GaAs substrate 511, and finally reaching the common electrode (back surface electrode 510). When more than one LED is energized, current flows through the individual electrode 508 of each LED into a corresponding pn junction, and then through the GaAsP epi-layer 512 and GaAs substrate 511. Therefore, the lager the number of energized LEDs, the larger the current flowing through the common portions.

Thus, when the common portions have a high resistance (resistance of semiconductor and the contact resistance between the semiconductor layer and the electrode) or when the current flowing through an LED is much larger than those flowing through other LEDs, the potential in the vicinity of the pn junction of individual LEDs goes up due to more than one LED is energized and the potential difference between the individual electrodes and common electrode varies. The LEDs are driven by drive ICs. If the load on the drive IC changes by more than a certain value, the output current of the drive IC changes by a large amount. If the resistance of common portion (i.e., semiconductor resistance and the contact resistance between the semiconductor and electrode) is relatively high, the power of light emitted from the LEDs varies by a large amount depending on the number of energized LEDs.

SUMMARY OF THE INVENTION

An object of the present invention is to provide an LED array in which the power of light emitted from the LEDs is not sensitive to the number of energized LEDs and the operating conditions at which the LEDs are energized.

Another object of the present invention is to provide an LED array in which the LEDs are stably energized. A semiconductor device includes a substrate, a common electrode, a semiconductor thin film, an individual electrode, and a wiring layer. The common electrode is formed of a conductive layer on the substrate. The semiconductor thin film is provided on the common electrode and includes at least one active region. The individual electrode is formed on an upper surface of the active region on the semiconductor thin film. The wiring layer includes one end portion formed on the semiconductor thin film except the upper surface of the active region and another end portion connected to the common electrode.

The semiconductor thin film is one of a plurality of semiconductor thin films aligned on the common electrode, each one of the plurality of semiconductor thin films including one active region.

The one end portion of the wiring layer is formed on a same surface of the semiconductor thin film as the individual electrode.

The individual electrode is formed on a first surface of the semiconductor thin film, and the one end portion of the wiring layer is formed on a second surface of the semiconductor thin film different form the first surface.

The active region constitutes a semiconductor element. The semiconductor element is a light emitting element.

The semiconductor thin film includes a GaAs contact layer, an $Al_xGa_{1-x}As$ clad layer, and an $Al_yGa_{1-y}As$ active layer.

The semiconductor thin film includes a first surface area through which the semiconductor thin film is bonded to the substrate, wherein the semiconductor element includes an active layer having a second surface area through which light is emitted, the second surface area being smaller than the first surface area. The light emitting element includes a semiconductor layer of a first conductivity type and an impurity region of a second conductivity type. The impurity region is selectively formed in the semiconductor layer to form a junction that emits light.

The light emitting element is a light emitting diode.

The plurality of semiconductor elements are aligned in a straight row.

The semiconductor thin film is one of a plurality of semiconductor thin films aligned in a straight row. Each one of the plurality of semiconductor thin films includes a first dimension and a second dimension longer than the first dimension. The first dimension extends in a first direction substantially parallel to the row, and the second dimension extends in a second direction substantially perpendicular to the first direction.

The semiconductor thin film is an epitaxial layer, and includes a pn junction in the form of the epitaxial layer.

An LED print head incorporating the semiconductor device of the aforementioned structure, and includes an optical system that directs light emitted from the light emitting element.

An image forming apparatus incorporates the aforementioned LED print head, and includes an image bearing body, a charging section, an exposing section, and a developing section. The charging section charges a surface of the image bearing body. The exposing section illuminates the charged surface of the image bearing body to form an electrostatic latent image. The developing section develops the electrostatic latent image into a visible image.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIG. 5 is a top view illustrating a pertinent portion of a semiconductor device according to a second embodiment;

DETAILED DESCRIPTION OF THE INVENTION

First Embodiment

Figure 1:
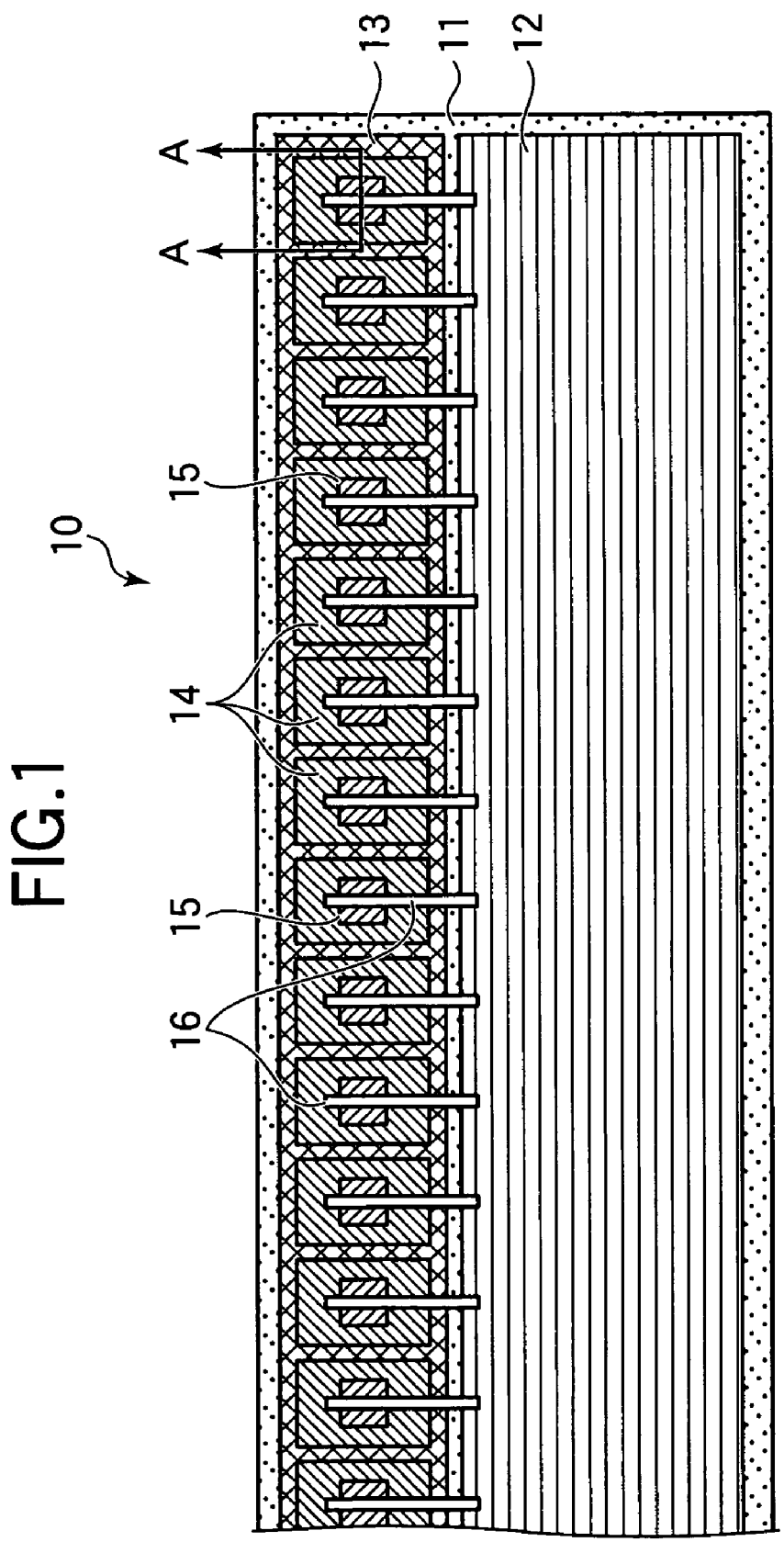
FIG. 1 is a top view illustrating a pertinent portion of a semiconductor device.

FIG. 1 is a top view illustrating a pertinent portion of a semiconductor device 10.

Figure 2:
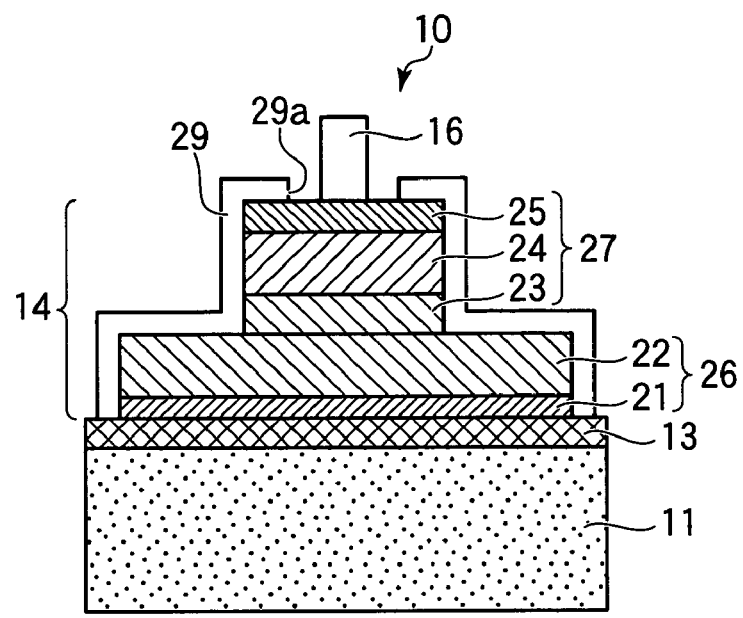
FIG. 2 is a cross sectional view taken along a line A-A of FIG. 1 illustrating a pertinent portion of the semiconductor device.

FIG. 2 is a cross sectional view taken along a line A-A of FIG. 1 illustrating a pertinent portion of the semiconductor device 10.

Referring to FIG. 1, the semiconductor device 10 includes an Si substrate 11, drive IC region 12, conductive layer 13, semiconductor epitaxial films (referred to as semiconductor epi-films hereinafter) 14 including light emitting elements 15, and individual electrodes 16. The drive IC region 12 is formed on the Si substrate 11, and the conductive layer 13 is formed on the Si substrate 11 adjacent to the drive IC region 12. The semiconductor epi-films 14 are bonded onto the conductive layer 13 and are spaced apart by a predetermined distance. The individual electrodes 16 are metal wires that connect between individual LEDs and the output terminals of the drive ICs in the drive IC region 12. The semiconductor epi-films 14 are aligned in a straight line or row. An interlayer dielectric film 29 (FIG. 2) has been omitted from FIG. 1 for the sake of simplicity.

FIG. 2 is a cross sectional view taken along a line A-A of FIG. 1 illustrating a portion of the semiconductor device 10. Referring to FIG. 2, the semiconductor device 10 includes more than one semiconductor epi-film 14. Each of the semiconductor epi-films 14 is formed on the conductive layer 13 which is on the Si substrate 11, and includes a contact layer 21 (e.g., n-type GaAs layer), lower clad layer 22 (e.g., n-type $Al_xGa_{1-x}As$ layer), active layer 23 (e.g., p-type $Al_yGa_{1-y}As$ layer), upper clad layer 24 (e.g., p-type $Al_xGa_{1-x}As$ layer), contact layer 25 (e.g., p-type GaAs layer), and interlayer dielectric film 29. The interlayer dielectric film 29 in FIG. 2 prevents wires and conductive layers from being short-circuited.

As shown in FIG. 2, a lower structure 26 is formed of the lower clad layer 22 and the contact layer 21. An upper structure 27 is formed of the active layer 23, upper clad layer 24, and contact layer 25. The lower structure 26 is larger in area than the upper structure 27 when the upper and lower structures are seen from above. The individual electrodes 16 are formed on the interlayer dielectric film 29 to make electrical contact with the contact layer 25 through an opening 29a formed in the interlayer dielectric film 29.

The active layer 23 serves as a light emitting region, which corresponds to the light emitting element 15 in FIG. 1. Each of the semiconductor epi-films 14 in FIG. 1 corresponds to a stacked-layer structure that includes the lower structure 26 and the upper structure 27 in FIG. 2, and corresponds to an individual LED. Active regions are individual regions that include elements contributing to light emitting operation.

Referring to FIG. 1, for high-density array of LEDs, the individual semiconductor epi-films 14 need to be aligned at small pitches or intervals and the width of the individual semiconductor films 14 also needs to be smaller. Therefore, if the bottom area of the semiconductor epi-film 14 is small, sufficient bonding strength cannot be obtained. Thus, the semiconductor epi-films 14 each have a smaller dimension in a direction in which the light emitting elements 15 are aligned than in a direction perpendicular to the direction in which the light emitting elements 15 are aligned, so that the semiconductor epi-film 14 has as large a bonding area as possible.

The method of manufacturing the semiconductor device 10 will be described.

Figure 3:
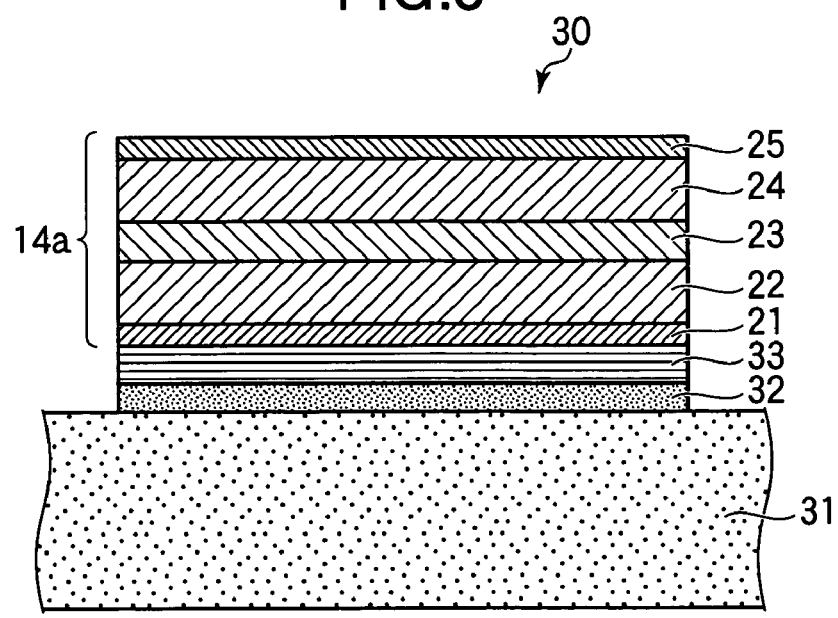
FIG. 3 illustrates the configuration of a semiconductor epitaxial wafer having a semiconductor epi-film.

FIG. 3 illustrates the configuration of a semiconductor epitaxial wafer 30 having a semiconductor epi-film 14a.

Referring to FIG. 3, a buffer layer 32 (e.g., GaAs layer), releasing layer 33 (e.g., AlAs layer), and semiconductor epi-film 14a are formed on a substrate 31 (e.g., GaAs substrate) in this order. The epi-film 14a is a semiconductor epitaxial layer having the same stacked structure as the semiconductor epi-film 14 in FIG. 2, and includes a contact layer 21, lower clad layer 22, active layer 23, upper clad layer 24, and contact layer 25.

Mesa etching is performed to define the semiconductor epi-film 14a that extends in a longitudinal direction. This semiconductor epi-film 14a is generally strip-shaped and has a predetermined size such that a predetermined number of LEDs can be defined and aligned in the longitudinal direction of the semiconductor epi-film 14a. After mesa etching, an etching mask used for mesa etching is still on the semiconductor epi-film 14a. Then, the entire semiconductor epitaxial wafer 30 is dipped in an etchant (e.g., 10% HF) to remove the releasing layer 33. Thus, the semiconductor epi-film 14a can be lifted off from the substrate 31 with the semiconductor epi-film 14a sitting on the etching mask.

FIGS. 4A-4E illustrate various stages in the fabrication process at which the semiconductor device 10 in FIG. 1 is fabricated. In FIGS. 4A-4E, the Si substrate 1 under the conductive layer is omitted for the simplicity sake.

Figure 4A:
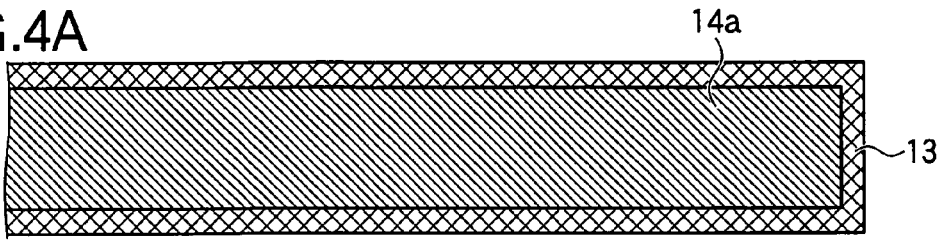
FIGS. 4A-4E illustrate various stages in the fabrication process at which the semiconductor device in FIG. 1 is fabricated.
Figure 11:
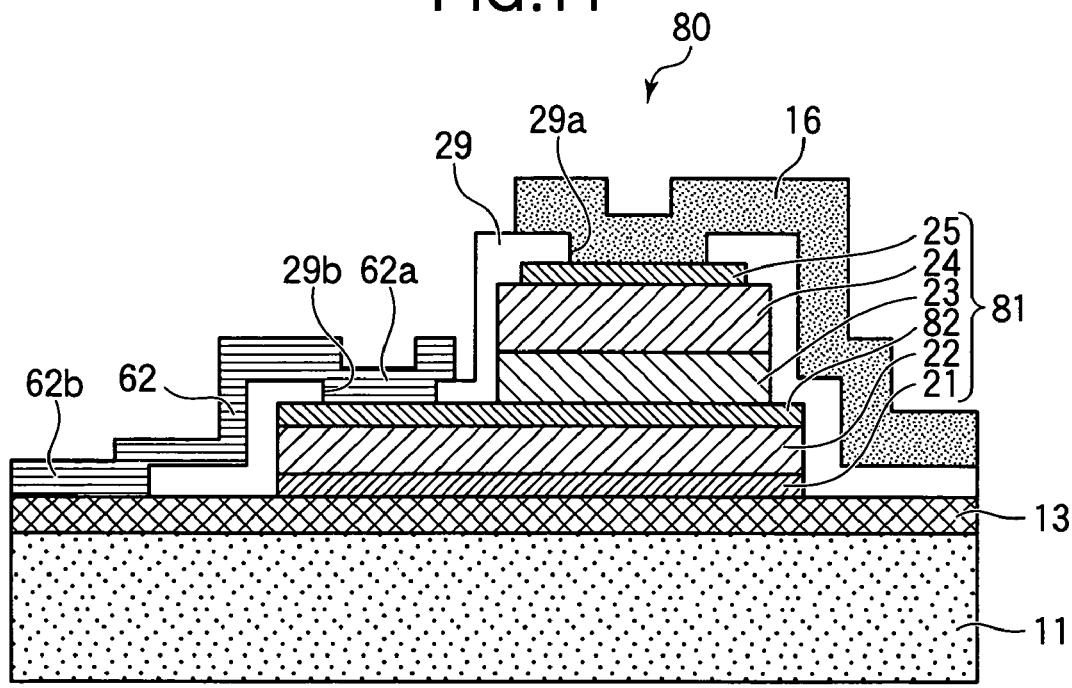
FIG. 11 is a cross sectional view illustrating a pertinent portion of a semiconductor device according to a fifth embodiment.

Referring to FIG. 4A, the semiconductor epi-layer 14a on the etching mask (a support member), not shown, is bonded onto the conductive layer 13 formed on the Si substrate 11 (FIG. 11). This bonding process establishes electrical contact between the conductive layer 13 and the contact layer 21 of the semiconductor epi-film 14a. Then, the etching mask is removed from the semiconductor epi-film 14a.

Figure 4B:
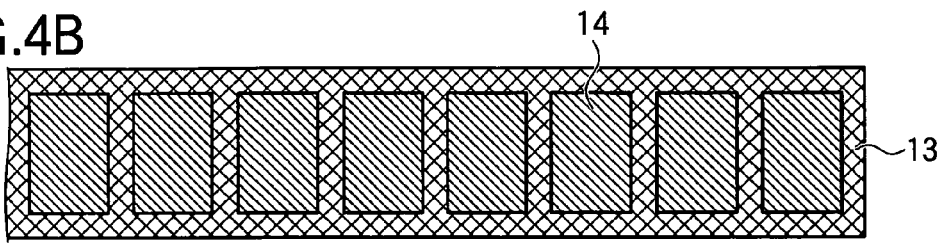
Figure 4C:
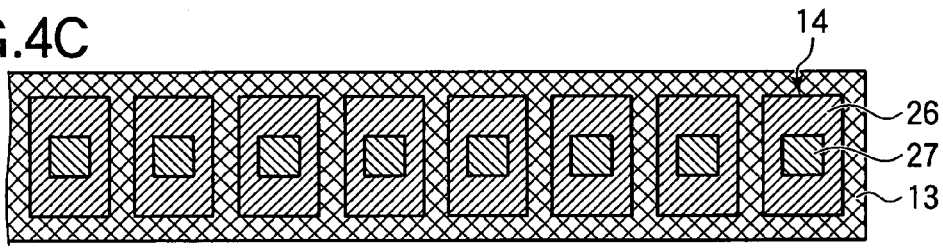

Referring to FIG. 4B, the mesa-etching is performed to etch the semiconductor epi-film 14a to form individual regions. Referring to FIG. 4C, the individual semiconductor epi-film 14 is further etched such that a lower structure 26 is larger in area than an upper structure 27 (FIG. 2).

The process for forming the island-like upper structure 27 in FIG. 4C may be performed prior to the process for dividing the semiconductor epi-film 14a into individual regions.

Figure 4D:
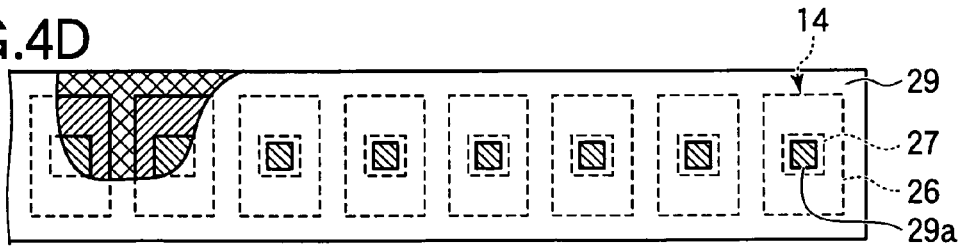
Figure 4E:
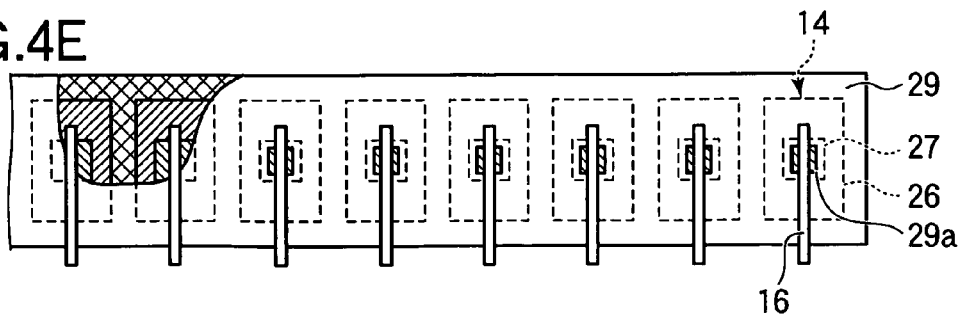

Referring to FIG. 4D, the interlayer dielectric film (e.g., $Si_xN_y$ film) 29 is formed and the opening 29a is formed in the interlayer dielectric film 29 above the contact layer 25 (FIG. 2) of the upper structure 27. Then, as shown in FIG. 4E, the individual electrodes 16 are formed on the interlayer dielectric film 29 such that each individual electrode 16 electrically contacts at its one end with the contact layer 25 through the opening 29a and at its another end with a corresponding one of individual drive output terminals, not shown, of the drive ICs formed in the drive IC region 12.

While the first embodiment has been described in terms of the semiconductor epi-film 14a bonded to a location on the Si substrate 11 (FIG. 1), the Si substrate 11 may have a region to which a plurality of semiconductor epi-films 14a are bonded, in which case, the bonded semiconductor epi-film 14a can be formed at one stage of fabrication process in the manner in FIGS. 4A-4E. The substrate is not limited to an Si substrate but may be selected from among a variety of substrates such as a Ge substrate, SiGe substrate, SiC substrate, GaN substrate, glass substrate, plastic substrate, ceramic substrate, and metal substrate.

As described above, the semiconductor epi-film 14a is bonded on the conductive layer 13. The semiconductor epi-film 14a is divided into individual semiconductor elements each of which has a light emitting diode (LED). Current flows through the respective semiconductor elements formed in the epi-films 14 directly to the conductive layer 13. Therefore, even if the bonded surfaces of the semiconductor epi-films 14 have a high contact resistance, the resistance (e.g., sheet resistance of the conductive layer 13 in the form of a metal layer) common to the respective semiconductor elements can be low. This minimizes the variation of potential in the common-resistance region which varies depending on the number of the LEDs energized at a time. Thus, the first embodiment minimizes the variation of the amount of light emitted from the LEDs that varies depending on the number of the LEDs energized at a time, so that the variation is not detectable.

Second Embodiment

Figure 6:
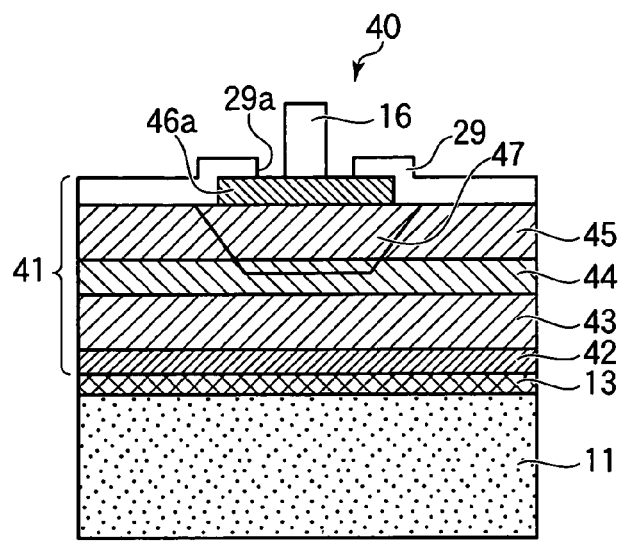
FIG. 6 is a cross sectional view taken along a line B-B of FIG. 5.
Figure 7:
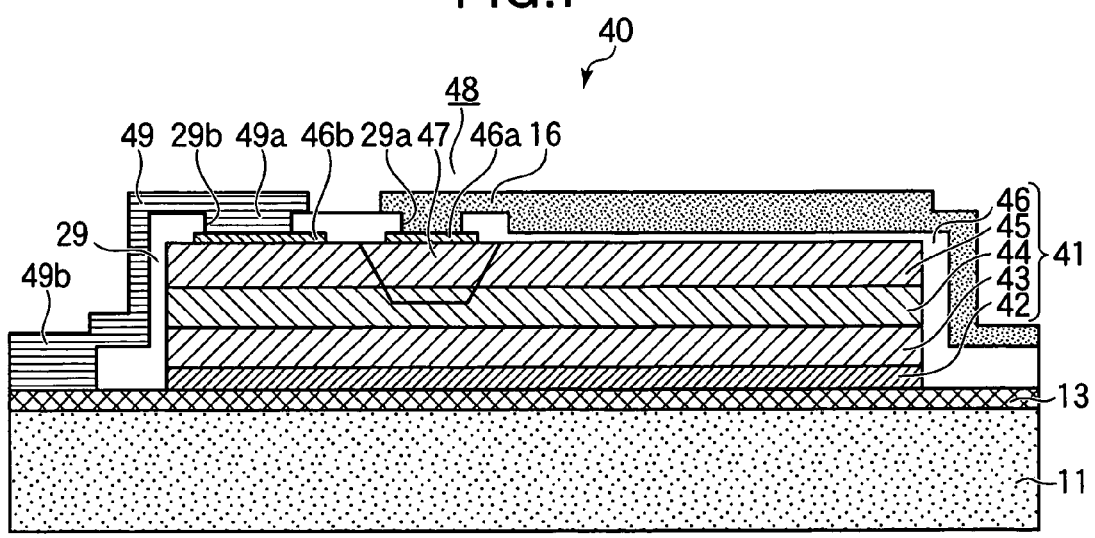
FIG. 7 is a cross sectional view taken along a line C-C of FIG. 5.

FIG. 5 is a top view illustrating a pertinent portion of a semiconductor device 40 according to a second embodiment. FIG. 6 is a cross sectional view taken along a line B-B of FIG. 5. FIG. 7 is a cross sectional view taken along a line C-C of FIG. 5. FIG. 5 shows the semiconductor device 40 with an interlayer dielectric film 29 (FIG. 6) omitted for the sake of simplicity.

The semiconductor device 40 according to the second embodiment only differs from the semiconductor device 10 according to the first embodiment in the configuration of a semiconductor epi-film 41 formed on a conductive layer 13, and the method of electrical connection between the semiconductor epi-film 41 and the conductive layer 13. Thus, the portions of the semiconductor device 40 common to the semiconductor device 10 have been given the same references and their description is omitted.

Referring to FIG. 6, the semiconductor device 40 includes an Si substrate 11, the conductive layer 13., the semiconductor epi-film 41, and the interlayer dielectric film 29 formed in this order from the bottom. The interlayer dielectric film 29 serves to prevent wires and conductive layers from being short circuited.

The semiconductor epi-film 41 includes a lower contact layer 42 (e.g., n-type GaAs layer), lower clad layer 43 (e.g., n-type $Al_xGa_{1-x}As$ layer), active layer 44 (e.g., n-type $Al_yGa_{1-y}As$ layer) upper clad layer 45 (n-type $Al_zGa_{1-z}As$ layer), and upper contact layer 46 (e.g., n-type GaAs layer) formed in this order from the bottom. The semiconductor epi-film 41 forms a semiconductor thin film of a first conductive type (here n-type). Diffusion regions 47 are selectively formed by diffusing an impurity of a second conductive type (here p-type) into an n-type semiconductor layer. Each diffusion region 47 has a diffusion front that forms a pn junction within the active layer 44, the diffusion front serving as a light emitting region.

After the diffusion regions 47 have been formed, the upper contact layer 46 is etched to form island-shaped upper contact pads 46a and an upper contact pad 46b such that the upper contact pad 46b extends on the upper clad layer 45 in a direction in which the light emitting regions 48 of the semiconductor epi-film 41 are aligned in a straight line. The upper contact pad 46b extends along the row of the light emitting regions 48 substantially all across the length of the row.

The light emitting region 48 in FIG. 5 corresponds to a region (FIG. 6) in which a pn junction is formed in the active layer 44 within the diffusion region 47. Individual electrodes 16 are formed on the interlayer dielectric film 29 to establish electrical connection with the upper contact pad 46a through the opening 29a formed in the interlayer dielectric film 29. The active layer 44 serves as a light emitting element (i.e., LED).

Referring to FIG. 7, the semiconductor device 40 includes the Si substrate 11, conductive layer 13, semiconductor epi-film (n-type semiconductor thin film) 41, and interlayer dielectric film 29 in this order from the bottom. The individual electrodes 16 are formed on the interlayer dielectric film 29 so that each individual electrode 16 electrically contacts at its one end with the upper contact pad 46a through the opening 29a and at its another end with a corresponding one of individual drive output terminals, not shown, of drive ICs formed in a drive IC region 12 (FIG. 5).

A wiring layer 49 extends in a direction parallel to the row of the light emitting regions 48, and across the entire length of the row. One end 49a of the wiring layer 49 is in electrical contact with the n-type semiconductor layer through an opening 29b, which is formed in the interlayer dielectric film 29 and is in alignment with the upper contact pad 46b. Another end 49b of the wiring layer 49 is in electrical contact with the conductive layer 13. The provision of the wiring layer 49 is advantageous in that a low-resistance contact is easy to form.

The method for manufacturing the semiconductor device 40 will be described.

The diffusion regions 47 (FIG. 7) are selectively formed in the semiconductor epi-film 41 to define the light emitting regions 48 therein that are aligned in a straight line and are space at predetermined intervals as shown in FIG. 5. After the interlayer dielectric film 29 has been formed on the semiconductor epi-film 41, the openings 29a are formed directly above the upper contact pads 46a, and the opening 29b is formed directly above the upper contact pad 46b. The opening 29b extends across the entire row of the light emitting regions 48.

Then, the individual electrodes 16 are formed on the interlayer dielectric layer 29, establishing electrical connection between the upper contact pads 46a in the diffusion regions 47 and corresponding individual drive output terminals of the drive ICs. At the same time, the wiring layer 49 is formed on the interlayer dielectric film 29 to make electrical connection between the conductive layer 13 and the upper contact pad 46b outside of the diffusion regions 47, the electrical connection being established through the opening 29b. This completes the formation of elements of the semiconductor device 40. The individual electrodes 16 and wiring layer 49 may be formed by a standard photolithographic process.

As described above, according to the second embodiment, one end of the wiring layer 49 is formed in electrical contact with the surface of the semiconductor epi-film 41. Another end of the wiring layer 49 is in electrical contact with the conductive layer 13. The drive current flows through small sheet resistances of the wiring layer 49 and conductive layer 13, which are very low resistances. Thus, even if the bonded surface of the semiconductor epi-film 41 has a high resistance, no current flows through the bonded surface through which the semiconductor epi-film 41 is bonded to the conductive layer 13 and therefore the power of light emitted from the light emitting elements is not affected at all. This minimizes the variation in potential in the common-resistance region which would otherwise vary depending on the number of LEDs energized at a time. Thus, the variation of the power of light emitted from LEDs that would otherwise vary depending on the number of LEDs energized at a time cannot be detectable.

The semiconductor epi-film 41 extends in its longitudinal direction and includes a plurality of the light emitting regions 48 aligned in a straight row. The semiconductor epi-film 41 is then lifted off from the substrate in a similar manner as in the first embodiment. However, it should be noted that the semiconductor epi-film 41 is not cut into a plurality of individual light emitting regions as opposed to the first embodiment. The semiconductor epi-film 41 extending in its longitudinal direction is directly bonded to the conductive layer 13, so that a large bonding surface area ensures good bonding effect. The semiconductor epi-film 41 is not divided even after it has been bonded to the conductive layer 13.

Because the contact of the wiring layer 49 is accomplished by forming a thin metal film on the semiconductor epi-film 41, even if the bonding interface condition of the semiconductor epi-film 41 varies, the variation in the resistance of the LEDs can be minimized.

Further, the second embodiment ensures a relatively large bonding area through which the semiconductor epi-film 41 is bonded to the conductive layer 13. This ensures strong bonding strength.

Third Embodiment

Figure 8:
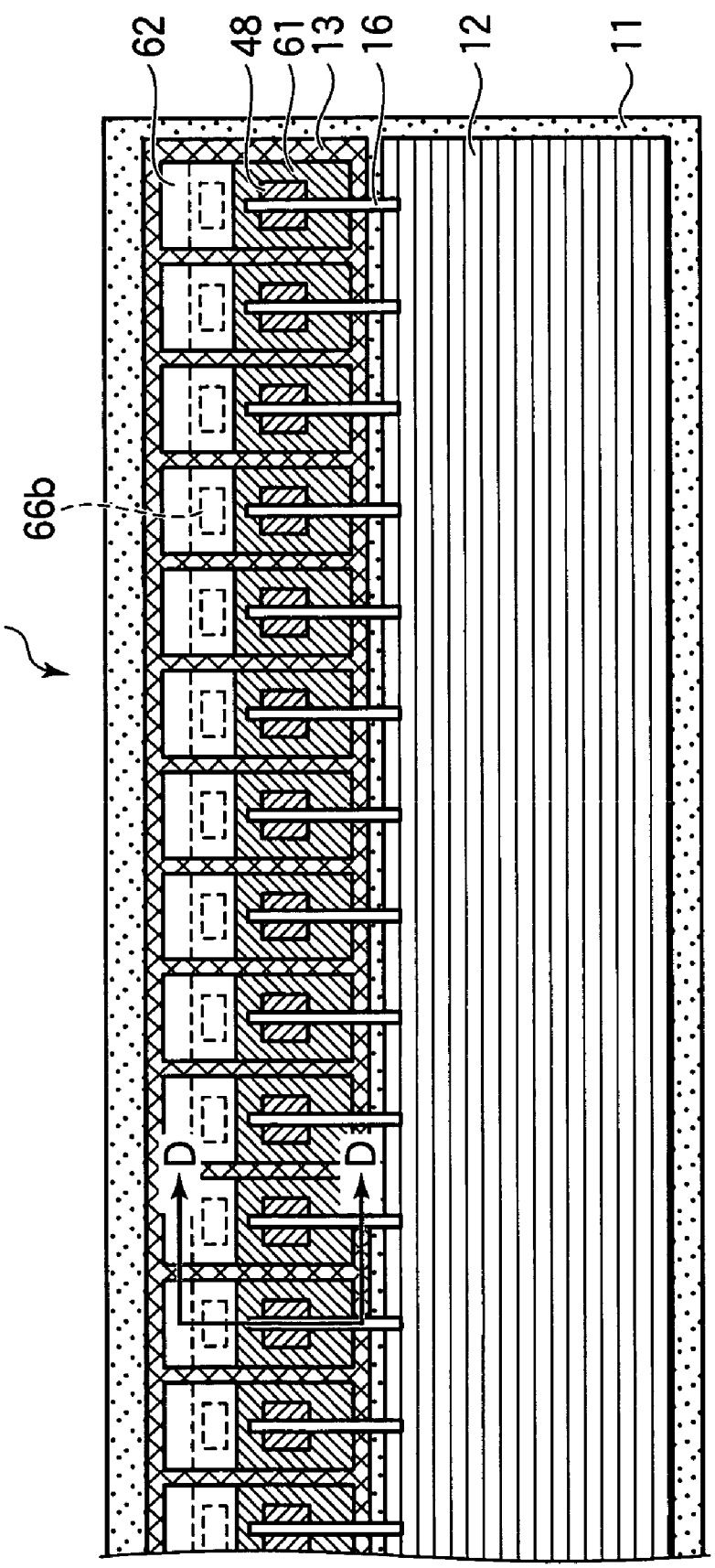
FIG. 8 is a top view illustrating a pertinent portion of a semiconductor device according to a third embodiment.
Figure 9:
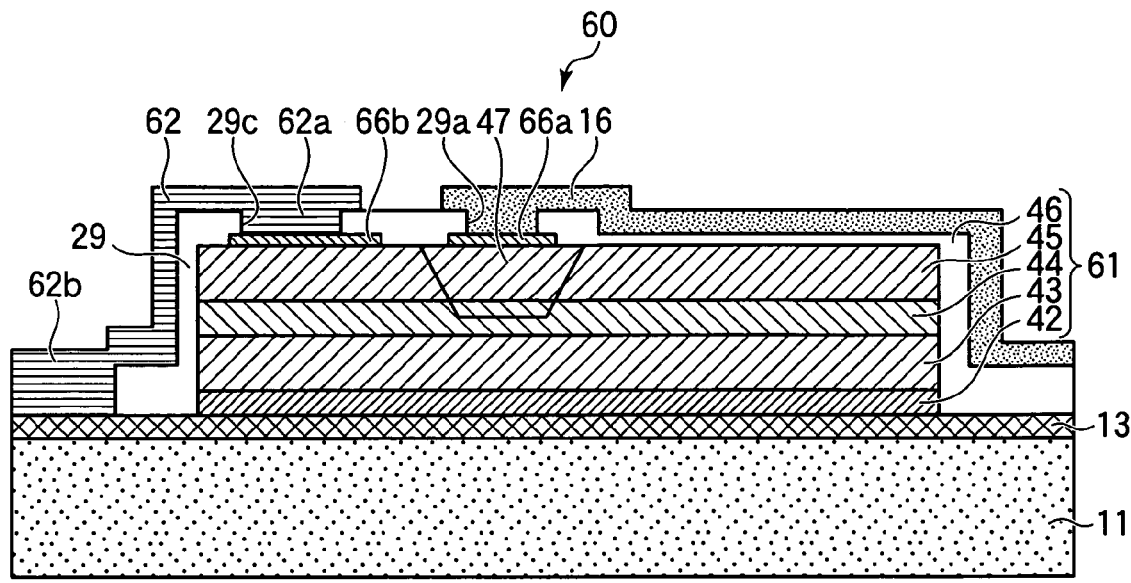
FIG. 9 is a cross sectional view taken along a line D-D of FIG. 8.

FIG. 8 is a top view illustrating a pertinent portion of a semiconductor device 60 according to a third embodiment. FIG. 9 is a cross sectional view taken along a line D-D of FIG. 8. FIG. 8 shows the semiconductor device 60 with an interlayer dielectric film 29 (FIG. 9) omitted for the sake of simplicity. The interlayer dielectric film 29 serves to prevent wires and conductive layers from being short circuited.

The semiconductor device 60 according to the third embodiment differs from the semiconductor device 40 according to the second embodiment in that a semiconductor epi-film 61 formed on the conductive layer 13 is dived into individual elements such that each element has a corresponding light emitting region 48. The configuration in which the semiconductor epi-film 61 is divided into individual elements is the same as that of the first embodiment. Thus, the portions of the semiconductor device 60 common to the semiconductor device 40 have been given the same references and their description is omitted.

Referring to FIG. 8, individual elements obtained by dividing the semiconductor epi-film 61 are aligned in a straight line on the conductive layer 13. The light emitting region 48 has the same configuration as the second embodiment as shown in FIG. 9. That is, the light emitting region 48 corresponds to a pn junction in the diffusion region 47 of a p-type impurity, the pn junction being formed in an active layer 44 and serving as a light emitting region.

After the diffusion regions 47 have been formed, the upper contact layer 66 is etched to form island-shaped upper contact pads 66a and an upper contact pad 66b such that each upper contact pad 66a is on a corresponding one of the diffusion regions 47 and each upper contact pad 66b is on the upper clad layer 45 and outside of a corresponding one of the diffusion regions 47. The upper contact 66b extends across the line of the light emitting regions 48.

Electrodes 62 are formed on the interlayer dielectric film 29 in correspondence with individual elements obtained by dividing the semiconductor epi-film 61. Each electrode 62 electrically contacts at its one end 62a with a corresponding upper contact 66b through the opening 29c, and at its another end 62b with the conductive layer 13.

The first and third embodiments are the same for the process in which the semiconductor epi-film formed on a substrate is divided into elements having a predetermined size. The second and third are substantially the same for the process in which the diffusion region and electrodes 62 are formed. Thus, the description of these processes is omitted.

As described above, the drive current flows through small sheet resistances of the electrode 62 and conductive layer 13, which are very low resistances. Thus, even if the bonded surface of the semiconductor epi-film 61 has a high resistance, no current flows through the bonded surface through which the semiconductor epi-film 61 is bonded to the conductive layer 13 and therefore the amount of light emitted from the light emitting elements is not affected at all. This minimizes the variation in the potential in the common-resistance region which would otherwise vary depending on the number of LEDs energized at a time. Thus, the third embodiment minimizes the variation of the power of light emitted from LEDs that would otherwise varies depending on the number of LEDs energized at a time, so that the variation is not detectable.

Because the contact of the electrode 62 is accomplished by forming a thin metal film on the semiconductor epi-film 61, if the bonding condition of the semiconductor epi-film 61 varies, the variation in the resistance of the LEDs can be minimized.

Fourth Embodiment

Figure 10:
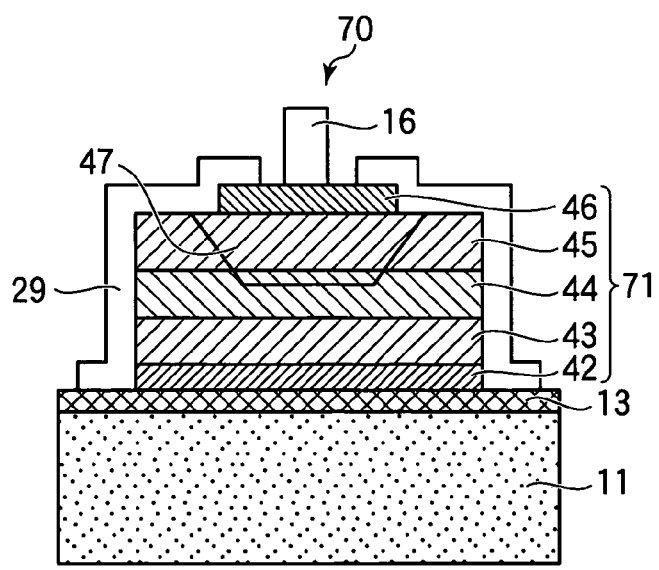
FIG. 10 is a cross sectional view illustrating a pertinent portion of a semiconductor device according to a fourth embodiment.

FIG. 10 is a cross sectional view illustrating a pertinent portion of a semiconductor device 70 according to a fourth embodiment. The semiconductor device 70 according to the fourth embodiment differs from the semiconductor device 10 according to the first embodiment in that the selectively diffusion type semiconductor epi-film 71 (FIG. 10) just as in the third embodiment is formed in place of the semiconductor epi-films 14 (FIG. 1) formed on the conductive layer 13. Thus, elements similar to those in the first and third embodiments have been given the same reference numerals and the description is omitted. The cross section in FIG. 10 corresponds to the cross section taken along a line A-A of FIG. 1.

With the semiconductor device 70, the electrode 62 (FIG. 9) of the third embodiment is not formed. Instead, just as in the semiconductor device 10 of the first embodiment, only a lower contact layer 42 is formed to make electrical contact with the conductive layer 13 that serves as n-side electrode.

The semiconductor device 70 of the aforementioned configuration provides the same advantages as the first embodiment.

Fifth Embodiment

FIG. 11 is a cross sectional view illustrating a pertinent portion of the semiconductor device 80 according to a fifth embodiment.

The semiconductor device 80 according to the fifth embodiment differs from the semiconductor device 60 according to the third embodiment in that the semiconductor epi-film 81 (FIG. 11) is used in place of the semiconductor epi-film 61, the semiconductor epi-film 81 being divided into individual elements by the mesa etching just as in the first embodiment. Thus, elements similar to those in the first or third embodiment have been given the same reference numerals and their description is omitted. The cross section in FIG. 11 corresponds to a cross section taken along a line D-D of FIG. 8.

The semiconductor epi-film 81 includes an n-type contact layer 82 is formed between the active layer 23 and the lower clad layer 22. One end 62*a* of the electrode 62 makes electrical contact with the n-type contact layer 82.

The semiconductor device 80 according to the fifth embodiment offers the same advantages.

Sixth Embodiment

Figure 12:
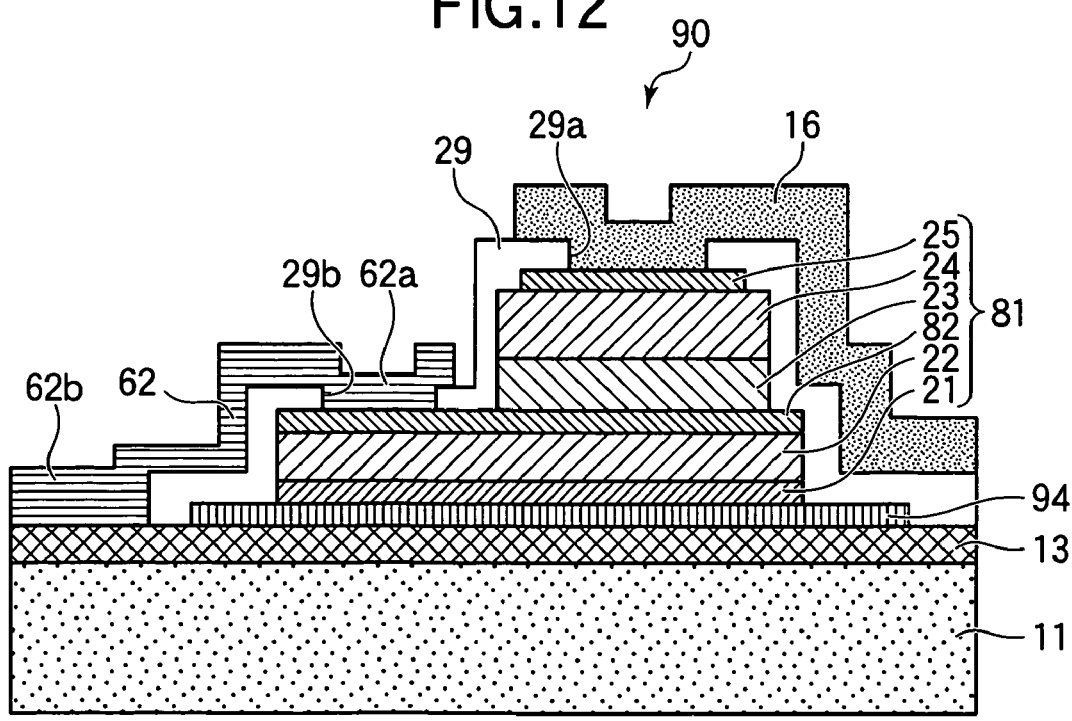
FIG. 12 is a cross sectional view illustrating a pertinent portion of a semiconductor device according to a sixth embodiment.

FIG. 12 is a cross sectional view illustrating a pertinent portion of the semiconductor device 90.

The semiconductor device 90 is equivalent to a device in which a dielectric film layer 94 is inserted between the active layer 13 and the contact layer 21 of the semiconductor device 80 in FIG. 11. The dielectric film layer 94 is a layer that contains a material selected from among an oxide, a nitride, an organic material or a combination of these materials.

The dielectric film layer 94 reflects the light emitted from the light emitting region in the semiconductor device 90 to the surface of the semiconductor device 90, thereby providing efficient utilization of emitted light.

While the sixth embodiment has been described in terms of a semiconductor device in which mesa etching is performed to form light emitting elements and the dielectric film layer 94 is formed between the conductive layer 13 and contact layer 21, the invention is not limited to such a semiconductor device.

Figure 13:
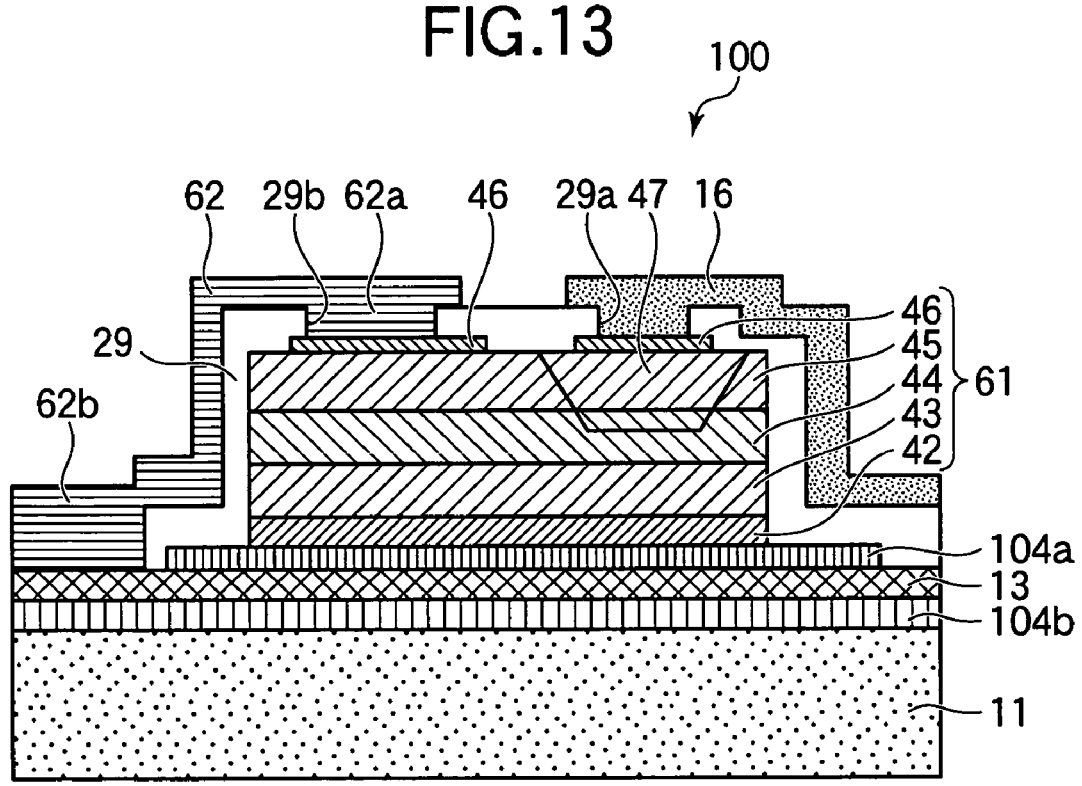
FIG. 13 illustrates a modification to the sixth embodiment.

FIG. 13 illustrates a modification to the sixth embodiment.

The sixth embodiment may take various forms. For example, the semiconductor device 100 in FIG. 13 may have the configuration of the semiconductor 60 according to the third embodiment. That is, the dielectric film layer 104*a* may be formed between the conductive layer 13 and the contact layer 42, and the dielectric film layer 104*b* may be formed between the conductive layer 13 and the Si substrate 11. The semiconductor device 100 in FIG. 13 is the same as the semiconductor device 60 according to the third embodiment except for the dielectric film layers 104*a* and 104*b*.

Seventh Embodiment

Figure 14:
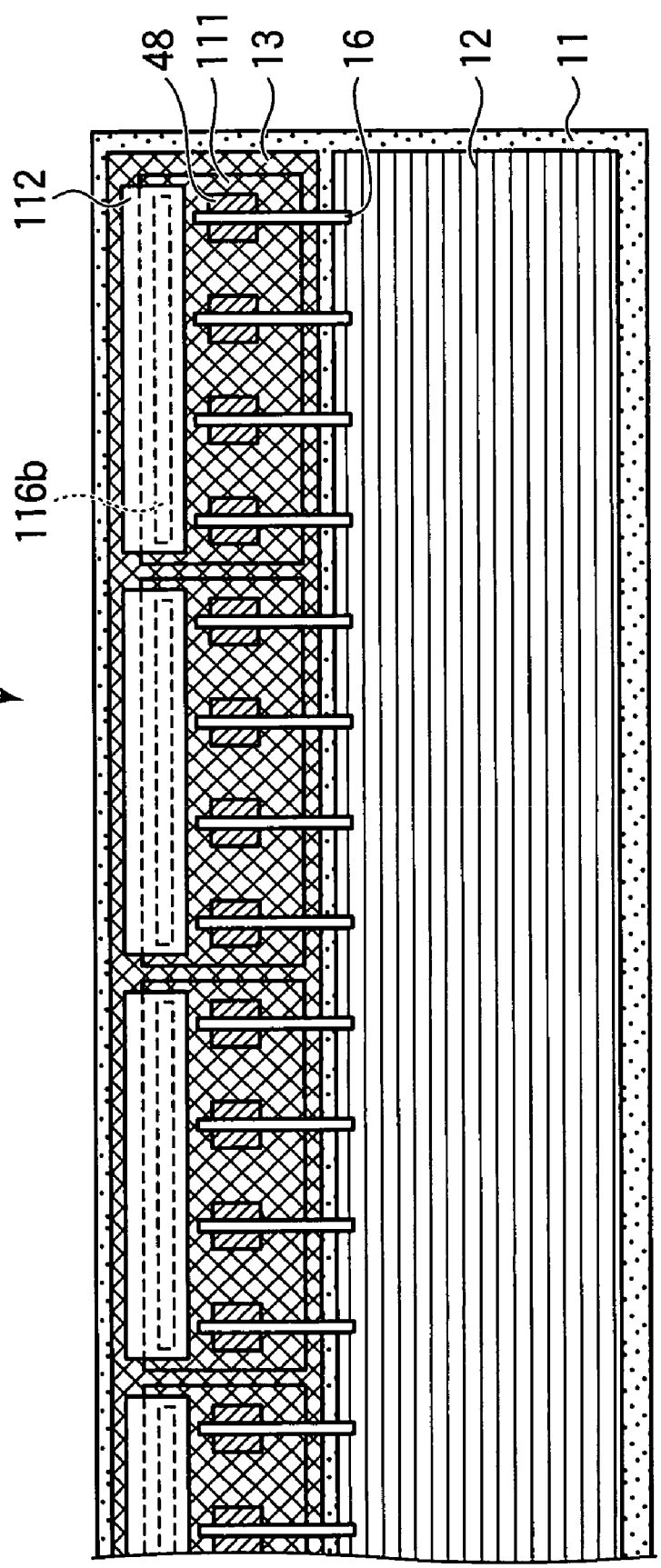
FIG. 14 is a top view illustrating a pertinent portion of a semiconductor device according to a seventh embodiment.

FIG. 14 is a top view illustrating a pertinent portion of a semiconductor device 110 according to a seventh embodiment.

The semiconductor device 110 according to the seven the embodiment differs from the semiconductor device 60 according to the third embodiment in that a semiconductor epi-film 111 formed on a conductive layer 13 is divided into individual elements each of which includes a plurality of light emitting regions 48. Elements similar to those of the semiconductor device 60 according to the third embodiment have been given the same reference numerals and their description is omitted.

Referring to FIG. 14, each of the four light emitting regions 48 of the semiconductor epi-film 111 includes an upper contact pad (not shown, but of the same configuration as the upper contact pad 66*b* in FIG. 9) in a diffusion region 47 (FIG. 9), and upper contact pad 116*b* that extends along the line of the four light emitting regions 48 and is located outside of the diffusion regions 47 (FIG. 9). Electrodes 112 are formed on the respective semiconductor epi-films 111, so that each electrode 112 establishes electrical connection between a corresponding upper contact pad 116*b* and the conductive layer 13.

Although the first to seventh embodiments have been described in terms of a composite configuration in which a semiconductor epi-film is bonded to a substrate having integrated circuits for driving the semiconductor elements, the invention is not limited to the composite configuration. For example, the connection regions between external circuits and the semiconductor epi-film including semiconductor elements are formed on a substrate of different material.

Although the first to seventh embodiments have been described in terms of a semiconductor epi-film in which light emitting elements are formed, the invention is not limited to this. For example, light receiving elements may be formed instead of light emitting elements or drive elements including transistor circuits may be formed. In fact, the invention may take a variety of forms.

The configuration of semiconductor epitaxial layer that forms light emitting elements may also take the form of a single hetero junction or a homo junction. The light emitting elements are not limited to LEDs but maybe laser diodes.

With the aforementioned respective embodiments, the conductive layer is formed under the semiconductor epi-film (i.e., semiconductor thin film). For the second and third embodiments, the conductive layer may be formed at a different location instead of under the semiconductor thin film, and the wire is formed to extend from the contact region on the semiconductor thin film to the conductive layer formed at the different location.

While the third embodiment has been described with respect to electrodes 62 connected to the same conductive layer 13, the electrodes 62 may also be connected to a plurality of conductive layer that can be independently controlled. For example, the first to fourth electrodes 62 are connected to a first conductive layer 1, the fifth to eighth electrodes 62 are connected to the second conductive layer 2, the ninth to twelfth electrodes 62 are connected to the third conductive layer 3, and so on.

Further, in addition to AlGaAs materials, the semiconductor epi-film may be formed of a III-V based chemical semiconductor such as AlGaInP, AlGaAsP, and InP, a II-VI based chemical compound semiconductor such as ZnSe, a III-V based nitride semiconductor, and semiconductor materials that contain Si and SiGe.

Eight Embodiment

Figure 15:
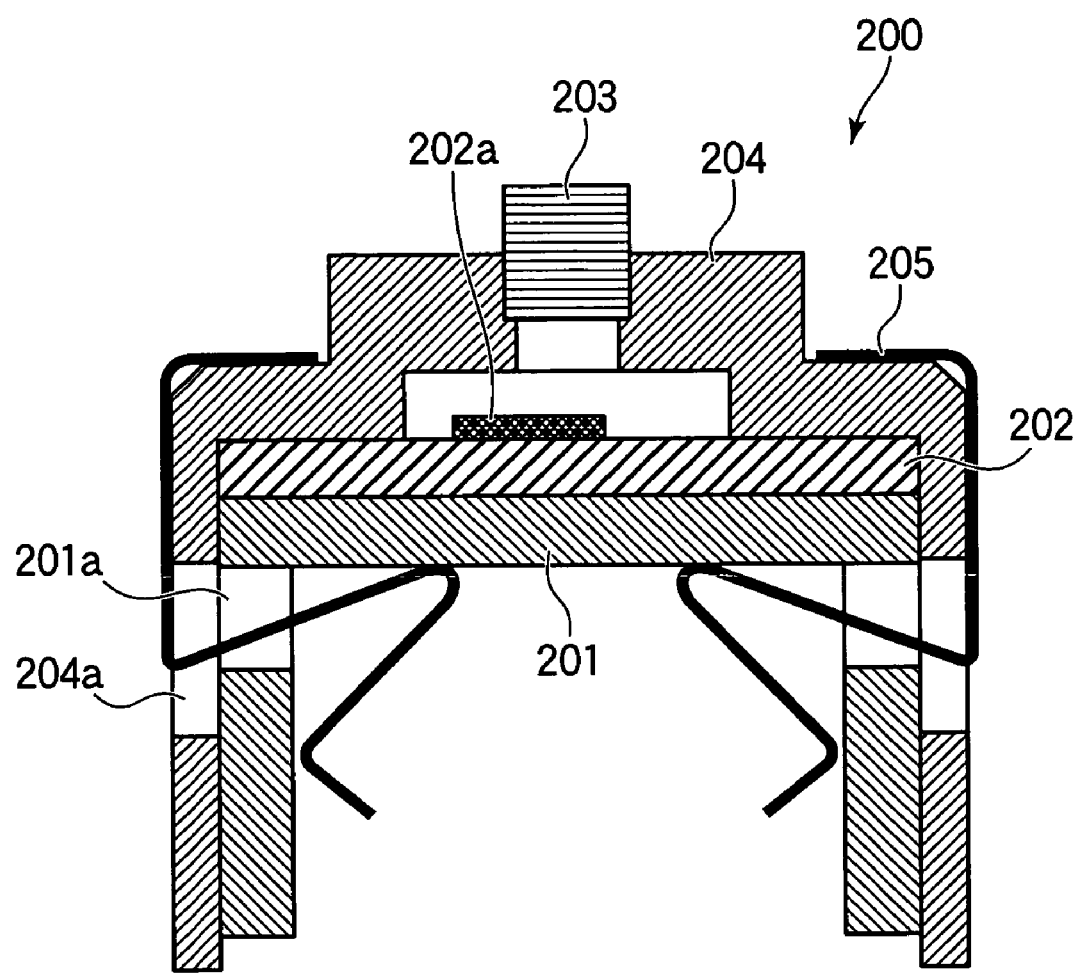
FIG. 15 is a cross sectional view of an LED print head on which a semiconductor device of the present invention is applied.

FIG. 15 is a cross sectional view of an LED print head on which the semiconductor device according to the present invention is applied.

Referring to FIG. 15, an LED print head 200 includes a base 201 and an LED unit 202 fixed on the base 201. The LED unit 202 employs one of the semiconductor devices 10 (FIG. 1), 40 (FIG. 5), 60 (FIG. 8), 70 (FIG. 10), 80 (FIG. 11), 90 (FIG. 12), 100 (FIG. 13), and 110 (FIG. 14). Thus, a light emitting unit 202*a* takes the form of one of the semiconductor epi-films 14 (FIG. 1), 41 (FIG. 5), 61 (FIG. 8, FIG. 13), 71 (FIG. 10), 81 (FIG. 11, FIG. 12), 111 (FIG. 14).

A rod lens array 203 is disposed over the light emitting unit 202*a*. The rod lens array 203 focuses the light emitted from the light emitting unit 202*a*. The rod lens array 203 includes column-shaped optical lenses aligned along a straight line of the light emitting elements (e.g., the arrangement of the light emitting elements 15 in FIG. 1), and is held in position by a lens holder 204.

The lens holder 204 is formed to cover the base 201 and LED unit 202. The base 201, LED unit 202, and lens holder 204 are held together by a clamper 205 attached to them through openings 201*a* and 204*a* formed in the base 201 and lens holder 204, respectively.

The light emitted from the LED unit 202 is radiated outwardly through the rod lens array 203. The LED print head 200 is used as an exposing unit for, for example, an electrophotographic printer and an electrophotographic copying machine.

As described above, the LED print head 202 employs any one of the semiconductor devices according to the previously mentioned embodiments. Thus, the emitted light does not vary depending on the light emitting conditions, ensuring reliable and stable light emitting performance.

Ninth Embodiment

Figure 16:
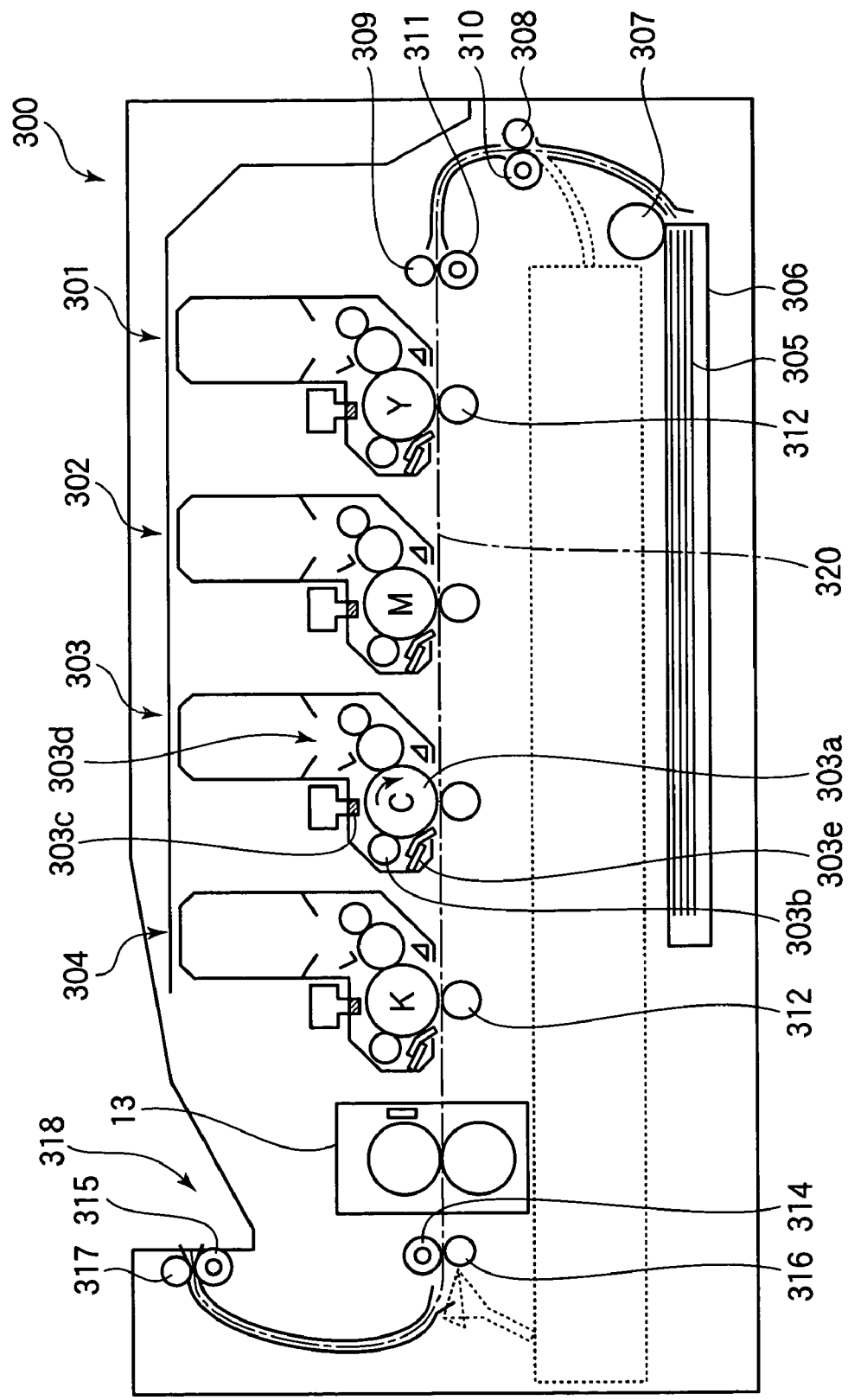
FIG. 16 is a schematic view illustrating an image forming apparatus that employs an LED print head according to the present invention.
Figure 17:
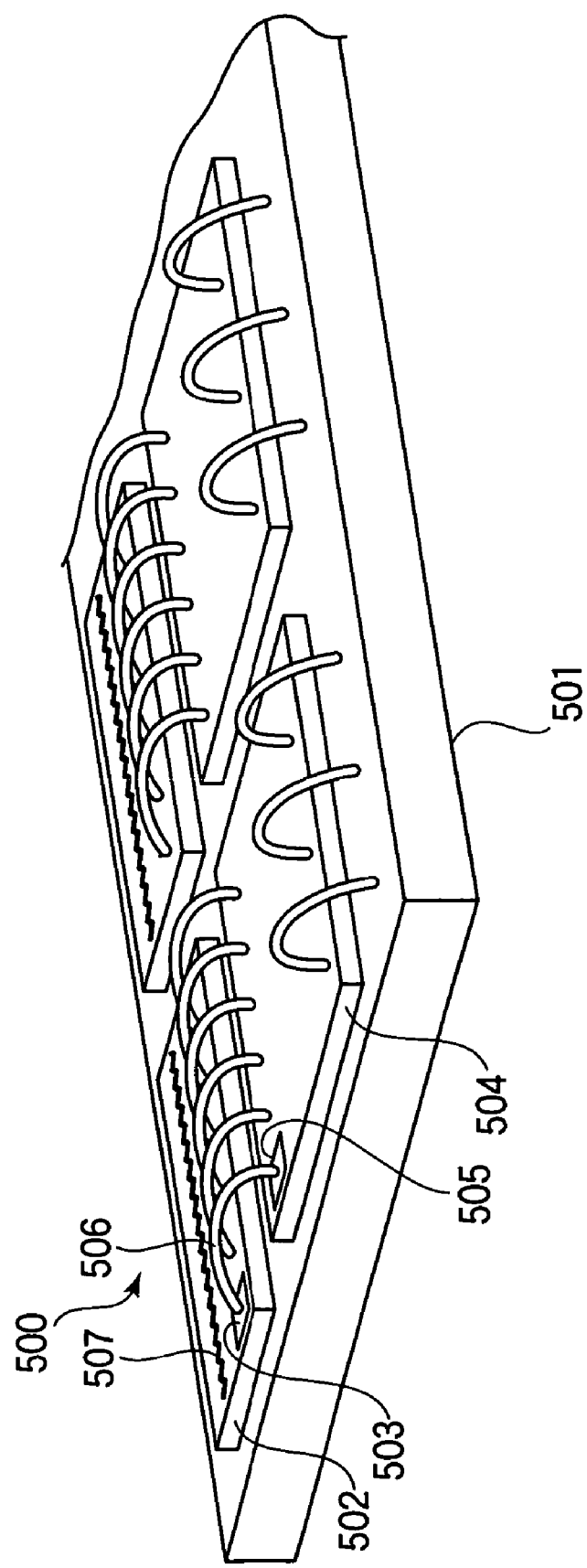
FIG. 17 is a schematic perspective view illustrating a portion of a conventional LED print print head.
Figure 18:
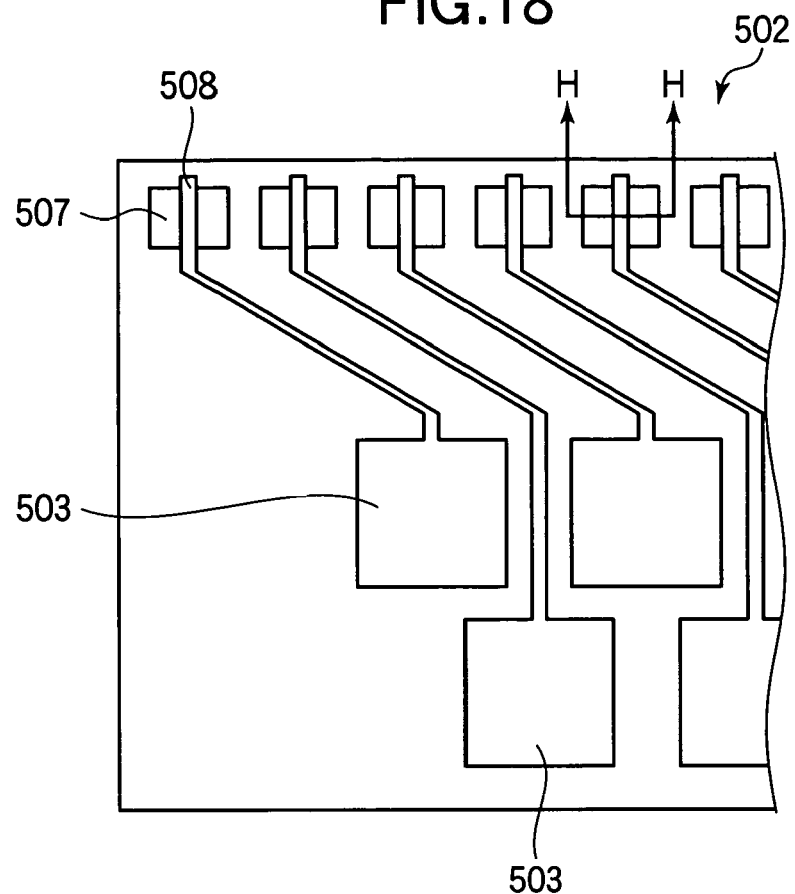
FIG. 18 is a top view illustrating a portion of an LED array chip that can be applied to the LED print head in FIG. 17.
Figure 19:
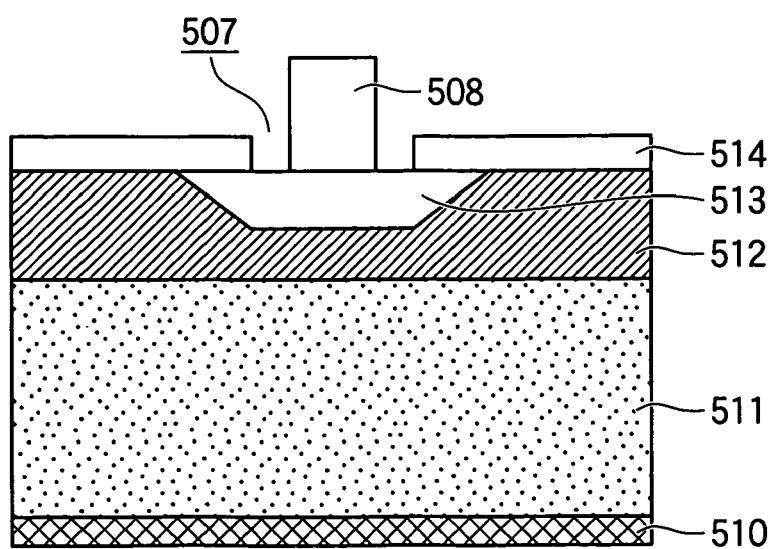
FIG. 19 is a cross sectional view taken along a line H-H of FIG. 18.

FIG. 16 is a schematic view illustrating an image forming apparatus that employs an LED print head according to the present invention.

Referring to FIG. 16, an image forming apparatus 300 includes process units 301-304 that are aligned in this order from upstream to downstream with respect to a transport path. The process units 301-304 form yellow, magenta, cyan, and black images, respectively. Each of the process units 301-304 may be substantially identical; for simplicity only the operation of the process unit 303 for forming cyan images will be described, it being understood that the other process units may work in a similar fashion.

The process unit 303 is arranged such that a photoconductive drum 303*a* is rotatable in a direction shown by an arrow. Disposed around the photoconductive drum 303*a* are a charging unit 303*b*, an exposing unit 303*c*, a developing unit 303*d*, and a cleaning unit 303*e*. The charging unit 303*b* charges the surface of the photoconductive drum 303*a*. The exposing unit 303*c* selectively illuminates the charged surface of the photoconductive drum 303*a* to form an electrostatic latent image. The developing unit 303*d* deposits cyan toner to the electrostatic latent image to develop the electrostatic latent image into a visible cyan image. The cleaning unit 303*e* removes residual toner from the photoconductive drum after transfer of the cyan image. Drive sources, not shown, transmit drive forces via gears to the drum and rollers in the image forming apparatus 300.

A paper cassette 306 holds a stack of recording medium 305 such as paper. A hopping roller 307 is disposed on the stack of recording medium 305 and feeds the recording medium 305 to a transport path on a page-by-page basis. Pinch roller 308 and feed roller 310 are disposed downstream of the hopping roller 307 with respect to the direction of travel of the recording medium 305. The pinch roller 308 and feed roller 310 cooperate to hold the recording medium in a sandwiched manner to transport the recording medium toward the registration roller 311. The registration roller 311 cooperates with a pinch roller 309 to feed the recording medium into the process unit 301 for yellow in timed relation with image formation in the process unit 301. The hopping roller 307, feed roller 310, and registration roller 311 are driven in rotation by drive forces transmitted from a drive source, not shown, through gears or the like.

Transfer rollers 312 are formed of a rubber material, and are disposed at locations where the transfer rollers 312 face photoconductive drums of the process units 301-304. When toner images are transferred from the photoconductive drums onto the recording medium 305, a high voltage is applied to the transfer rollers 312. The applied high voltage creates a potential difference between the photoconductive drums and the corresponding transfer rollers 312. The toner images are transferred onto the recording medium due to the potential difference.

A fixing unit 313 includes a heat roller and a pressure roller. When the recording medium 305 passes through a fixing point defined between the heat roller and pressure roller, the toner image on the recording medium is fused into a permanent image under pressure and heat. Discharge roller 314 cooperates with a pinch roller 316 to transport the recording medium 305 and discharge from the fixing unit 313 toward a discharge roller 316. The discharge roller 316 cooperates with a pinch roller 317 to discharge the recording medium 305 onto the stacker 318. The discharge rollers 315 and 316 and pinch rollers 316 and 317, hopping roller 307, feed roller 310, and registration roller 311 are driven in rotation by drive forces transmitted from a drive source, not shown, through gears or the like. An exposing unit 303c employs the LED print head 200 described in the eighth embodiment.

The operation of the image forming apparatus of the aforementioned configuration will be described.

The hopping roller 307 feeds the recording medium 305 to the transport path on a page-by-page basis. Then, the feed roller 310 and pinch roller 308 cooperate with each other to transport the recording medium 305 to the registration roller 311. The exposing unit of the process unit 301 for yellow illuminates the charged surface of the photoconductive drum to form an electrostatic latent image. Then, a developing unit deposits yellow toner to the electrostatic latent image to develop the electrostatic latent image into a yellow toner image. The registration roller 311 cooperates with the pinch roller 309 to feed the recording medium 305 into the process unit 301 for yellow in timed relation with image formation in the process unit 301. As the recording medium passes through the transfer point defined between the photoconductive drum 303a and the transfer roller 312, the toner image is transferred onto the recording medium 305.

As the recording medium 305 further advances through the process units 302-304 in sequence, the toner images of the respective colors are transferred onto the recording medium 305 one over the other in registration.

The recording medium 305 then advances to the fixing unit 313. As the recording medium passes through the fixing unit 313, the toner images are fused under heat and pressure. The recording medium 305 is then transported by the discharge rollers 314 and the pinch roller 316 through the discharge path, and is finally discharged onto the stacker 318 by the discharge roller 315 and the pinch roller 317.

The use of the LED print head according to the eighth embodiment offers an image forming apparatus capable of producing images having stable density.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor device comprising:
   a substrate;
   a common electrode formed of a metal layer on said substrate;
   a semiconductor thin film provided on said common electrode and including at least one operative region, said semiconductor thin film being disposed over said common electrode such that said semiconductor thin film is entirely disposed within an area defined by a perimeter of an upper surface of said common electrode, so that no portion of said semiconductor thin film extends beyond the perimeter of the upper surface;
   an individual electrode formed on said semiconductor thin film such that said individual electrode is electrically coupled with a first conductive side of said at least one operative region; and
   a wiring layer including a first end portion and a second end portion, the first end portion being physically and electrically connected to said common electrode, the second end portion being formed on said semiconductor thin film and being electrically coupled with a second conductive side of said at least one operative region.

2. The semiconductor device according to claim 1, wherein each of said at least one operative region constitutes a semiconductor element.

3. The semiconductor device according to claim 2, wherein said at least one operative region includes at least two operative regions, and said at least two operative regions constitute a plurality of semiconductor elements and the plurality of semiconductor elements are aligned in a straight row.

4. The semiconductor device according to claim 2, wherein the semiconductor element is a light emitting element.

5. The semiconductor device according to claim 4, wherein said semiconductor thin film includes a GaAs contact layer, an $Al_xGa_{1-x}As$ clad layer, and an $Al_yGa_{1-y}As$ active layer.

6. The semiconductor device according to claim 4, wherein the semiconductor thin film includes a first surface area through which the semiconductor thin film is bonded to said substrate, wherein the semiconductor element includes an active layer having a second surface area through which light is emitted, the second surface area being smaller than the first surface area.

7. The semiconductor device according to claim 4, wherein the light emitting element includes a semiconductor layer of a first conductivity type and an impurity region of a second conductivity type, the impurity region being selectively formed in the semiconductor layer to form a junction that emits light.

8. The semiconductor device according to claim 4, wherein the light emitting element is a light emitting diode.

9. An LED print head incorporating said semiconductor device according to claim 8, comprising an optical system that directs light emitted from the light emitting element.

10. An image forming apparatus incorporating said LED print head according to claim 9, comprising:
    an image bearing body;
    a charging section that charges a surface of said image bearing body;
    an exposing section that illuminates the charged surface of said image bearing body to form an electrostatic latent image; and
    a developing section that develops the electrostatic latent image into a visible image.

11. The semiconductor device according to claim 1, wherein said semiconductor thin film is an epitaxial layer and include a pn junction in the form of the epitaxial layer.

12. The semiconductor device according to claim 1, wherein said semiconductor thin film is disposed directly on said common electrode.

13. The semiconductor device according to claim 1, wherein said common electrode extends such that said at least one operative region is disposed within the area defined by the perimeter of the upper surface.

14. The semiconductor device according to claim 1, wherein said common electrode extends further than said semiconductor thin film in a direction substantially perpendicular to a direction in which said at least one operative region is aligned.

15. The semiconductor device according to claim 1, wherein said wiring layer is a separate element from said individual electrode.

16. A semiconductor device comprising:

a substrate;

a plurality of operative regions formed in a single semiconductor thin film or each one of the plurality of operative regions being formed in a corresponding one of separate semiconductor thin films;

a common electrode formed of a metal layer on said substrate such that the semiconductor thin film or films are disposed over said common electrode, said common electrode extending such that the plurality of operative regions are within an area defined by a perimeter of said common electrode, and no portion of the semiconductor thin film or films extends beyond said common electrode at least in a direction substantially perpendicular to a direction in which the plurality of operative regions are aligned;

a plurality of individual electrodes formed on the semiconductor thin film or films such that said individual electrodes are electrically coupled with a first conductive side of corresponding operative regions; and a wiring layer including a first end portion and a second end portion, the first end portion being physically and electrically connected to said common electrode and the second end portion being formed on the semiconductor thin film or films such that said wiring layer is electrically coupled with a second conductive side of the corresponding operative regions.

17. The semiconductor device according to claim 16, wherein said wiring layer is a separate element from said plurality of individual electrodes.

* * * * *